United States Patent
Dang et al.

(10) Patent No.: US 6,675,331 B1
(45) Date of Patent: Jan. 6, 2004

(54) TESTABLE TRANSPARENT LATCH AND METHOD FOR TESTING LOGIC CIRCUITRY THAT INCLUDES A TESTABLE TRANSPARENT LATCH

(75) Inventors: Lich X Dang, Houston, TX (US); Andrew M. Love, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 546 days.

(21) Appl. No.: 09/713,584

(22) Filed: Nov. 15, 2000

Related U.S. Application Data

(60) Provisional application No. 60/171,434, filed on Dec. 22, 1999.

(51) Int. Cl.$^7$ .............................. G01R 31/28; G06F 1/12; H03K 19/00
(52) U.S. Cl. ........................ 714/724; 713/400; 713/600; 710/20; 326/22; 326/94
(58) Field of Search .......................... 714/724; 713/400, 713/600; 710/20, 61, 60, 129, 130; 327/199, 225, 298, 403, 407, 241; 326/22, 94

(56) References Cited

U.S. PATENT DOCUMENTS

| | | | | |
|---|---|---|---|---|
| 5,539,337 A | * | 7/1996 | Taylor et al. | 326/94 |
| 6,334,163 B1 | * | 12/2001 | Dreps et al. | 710/129 |
| 6,542,999 B1 | * | 4/2003 | Dreps et al. | 713/400 |

* cited by examiner

*Primary Examiner*—Emmanuel L. Moise
(74) *Attorney, Agent, or Firm*—Robert D. Marshall, Jr.; W. James Brady, III; Frederick J. Telecky, Jr.

(57) ABSTRACT

A transparent latch (18) and a logic conditioning circuit (10) are disclosed. The transparent latch (18) receives signals from conditioning circuit (10), including a test input that indicates whether the transparent latch is in a testing mode or an operational mode. When the transparent latch (18) is in a testing mode, the transparent latch acts as a buffer or flow-through logic circuitry, permitting the logic circuitry that includes transparent latch (18) to be tested according to existing test methodologies. When the transparent latch is not in testing mode, the transparent latch (18) acts as a transparent latch (18), holding the state of the input when the clock signal is in a first state and allowing the input to propagate to the output when the clock signal is in a second state.

12 Claims, 1 Drawing Sheet

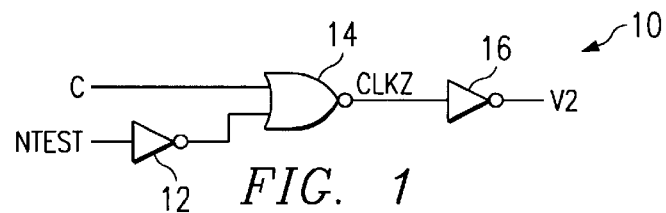
FIG. 1
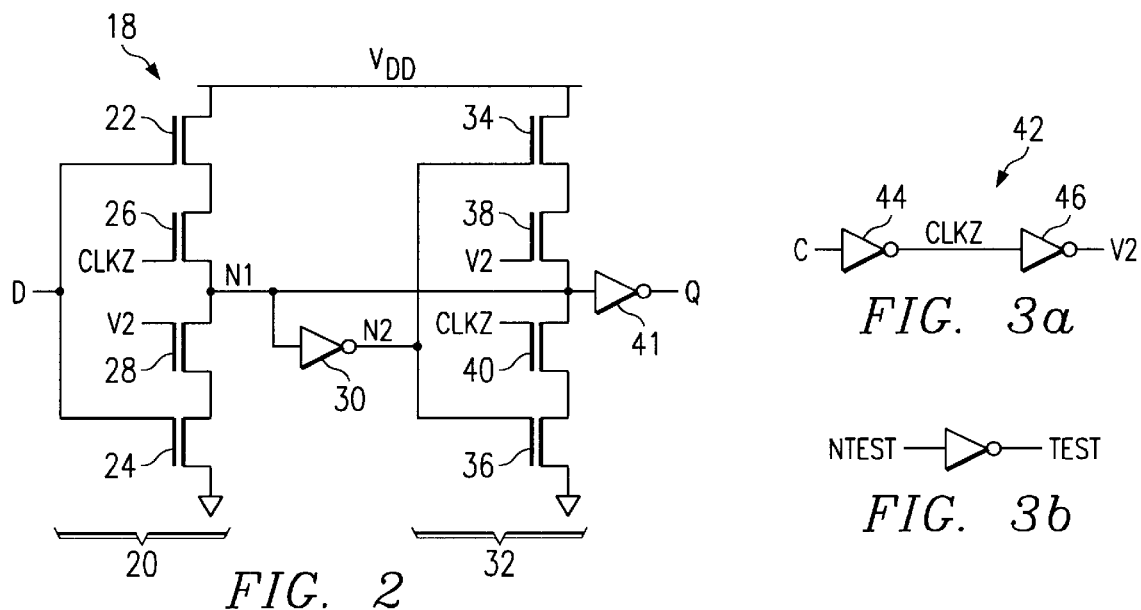
FIG. 2
FIG. 3a
FIG. 3b
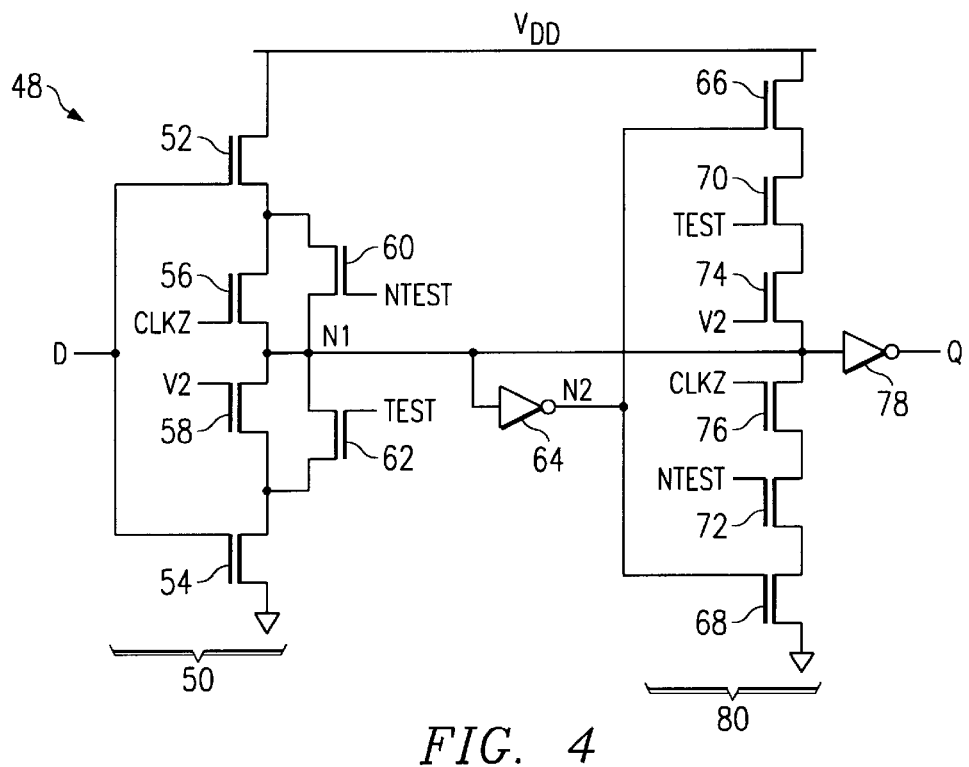
FIG. 4

TESTABLE TRANSPARENT LATCH AND METHOD FOR TESTING LOGIC CIRCUITRY THAT INCLUDES A TESTABLE TRANSPARENT LATCH

This application claims the benefit of Provisional application Ser. No. 60/171,434 filed Dec. 22, 1999.

TECHNICAL FIELD OF THE INVENTION

The present invention relates to digital circuitry, and, more particularly, to a testable transparent latch and a method for testing logic circuitry that includes a transparent latch.

BACKGROUND OF THE INVENTION

In the field of digital electronics, a latch is a logic element or device that stores the logic state of its output when a clock or other input is low, and that permits input signals to propagate through the device transparently when the a clock or other input is high. When the clock input is high, the latch acts as a buffer or flow-through logic circuitry, permitting the input signals to propagate freely to the output of the device. When the clock input goes low, the latch stores the logic state of its output, even if one or more logic states at the input of the device have changed during the period that the clock input to the device is low. When the clock input changes from low to high, the logic signals at the input of the device begin to propagate through the device and the device again acts like a buffer or flow-through logic circuitry.

An edge-triggered latch is a latch whose input is sampled at the time of a rising or falling edge on the input clock. In the case of a rising edge-triggered latch, the input of the latch would only be sample for propagation to the output on a rising edge of the clock. Transparent latches are preferred over edge-triggered latches as components of logic circuitry because of the smaller size and higher performance characteristics of transparent latches. Transparent latches are also useful in logic circuitry because transparent latches can alleviate delays in logic circuitry that are introduced by a series of edge-triggered flip-flops. Transparent latches, however, often have poor testability characteristics.

The logic circuitry of integrated circuits is tested for manufacturing defects. During testing, a multiplexer in the integrated circuit switches some of the inputs of the flow-through logic circuitry to testing circuitry for testing the logic circuitry, while the other inputs of the flow-through logic circuitry remain connected to the outputs of the edge-triggered latches, as they are during non-test operation. Other multiplexers switch the inputs of the edge-triggered latches to the outputs of neighboring edge-triggered latches, so that the edge-triggered latches form a chain. For the inputs that are switched to the testing circuitry, the inputs are supplied by the testing circuitry. For the inputs that are connected to the outputs of the edge-triggered latches, the chain of latches is clocked repeatedly, so that a logic state can be loaded onto each latch output by applying those states serially to the input of the first latch in the chain. In this manner, the logic states at all the inputs of the flow-through logic circuitry can be controlled and allowed to propagate through the flow-through logic circuitry.

The outputs of the logic circuitry can be read and compared to the outputs predicted by the a computer simulation of the operation of the logic circuitry. In the case of flow-through logic outputs that can propagate to the testing circuitry, these outputs are read by the testing circuitry. In the case of flow-through logic outputs that are connected to edge-triggered latches, the multiplexers switch the latch inputs back to the flow-through logic and a single clock edge is applied to the logic circuitry to cause the latches to capture the states of the outputs. The multiplexers then switch the latch inputs back so that the latches form a chain again. The logic circuitry is then clocked repeatedly so that the outputs can be read serially from the output of the last latch in the chain.

As compared with edge-triggered latches or flow-through logic circuitry, transparent latches are difficult to control during the testing process. Because the output of a transparent latch is dependent on the state of a clock input, rather than on an edge of a clock input, a transparent latch does not behave like an edge-triggered flip-flop or flow-through logic circuitry during testing. Further, most testing schemes assume that all logic circuitry on the integrated circuit is edge-triggered or flow-trough logic circuitry. Because the propagation of logic signals through a transparent latch is dependent on the logic state of a clock input, it is difficult to measure the output of a logic circuit by controlling the inputs to a transparent latch. As such, testing schemes that test logic circuitry by controlling the inputs to the logic circuitry and comparing the outputs against predicted outputs are not suitable for transparent latches.

SUMMARY OF THE INVENTION

In accordance with the present invention, a transparent latch and a method for testing a transparent latch are provided that substantially eliminate or reduce disadvantages and problems associated with prior transparent latches and testing schemes for transparent latches.

A transparent latch is often included as a component of the logic circuitry of an integrated circuit. The transparent latch that is described herein includes a testing signal and a clock signal. When the testing signal indicates that the logic circuitry is in a testing mode, the transparent latch acts as a buffer or flow-through logic circuitry. When the testing signal indicates that the logic circuitry is not in a testing mode, the transparent latch behaves as a transparent latch, latching or holding the output signal when the clock signal is in a first logic state and permitting the input signal to propagate to the output when the clock signal is an opposite logic state.

A technical advantage of the present invent is a transparent latch that is testable according to existing logic circuitry testing methodologies. Because testing methodologies exist for flow-through logic circuitry, when the transparent latch is in testing mode and caused to act as a buffer or flow-through logic circuitry, the transparent latch is testable. As such, new testing methodologies need not be developed to accommodate the functionality of the transparent latch. Thereby, a given level of test coverage can be achieved with less time and effort in the development and application of test vectors.

Another technical advantage of the present invention is the provision of a testable transparent latch that does not markedly increase the number of transistors from that of a standard transparent latch. The transparent latch of the present invention is made testable with the addition of only a few transistors to the design of a transparent latch. The transparent latch of the present invention is also advantageous in that it does not markedly reduce the performance from that of a standard transparent latch. Further, the transparent latch of the present invention can be incorporated into an existing design that includes a transparent latch without causing a significant delay in the design of the logic circuitry.

Another technical advantage of the present invention is that logic circuitry that includes a transparent latch as described herein is made more dependable and predictable. Because a testable transparent latch of the type described herein is testable according to existing testing schemes, logic circuitry that includes transparent latches can be tested and verified to a greater degree of accuracy and predictability.

Other technical advantages of the present invention will be readily apparent to one skilled in the art from the following figures, descriptions, and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein:

FIG. 1 is a logic gate diagram of a conditioning circuit for the inputs of a transparent latch;

FIG. 2 is a circuit diagram of a transparent latch;

FIGS. 3a and 3b are logic gate diagrams of conditioning circuits for the inputs of a transparent latch; and FIG. 4 is a circuit diagram of a transparent latch.

DETAILED DESCRIPTION OF THE INVENTION

FIG. 1 is a logic gate diagram of a transparent latch conditioning circuit, indicated generally at 10. The transparent latch conditioning circuit conditions a set of signals that serve as inputs to a transparent latch. The inputs to latch condition circuit 10 are clock signal C and testing signal NTEST. Clock signal C is the clock signal for the transparent latch and signal NTEST is a signal that identifies whether the logic circuitry of the transparent latch is in testing mode or in operational mode. When the logic circuitry of the transparent latch is in testing mode, the signal NTEST is set to a logical low. When the logic circuitry of the transparent latch is not in testing mode, signal NTEST is set to a logical high. Signal NTEST is the input of inverter 12. The output of inverter 12 and signal C are the inputs of NOR gate 14. The output of NOR gate 14 is signal CLKZ. Signal CLKZ is a logical high only when signal C is a logical low and signal NTEST is a logical high. For all other logic states of signals C and signal NTEST, signal CLKZ is a logical low. Thus, when NTEST is high, indicating that the latch is in operational mode, signal CLKZ is the inversion of signal C. When NTEST is low, indicating that the latch is in testing mode, signal CLKZ is forced low, as though clock input C were high throughout the period during which the latch is in testing mode. Signal CLKZ is the input of inverter 16. The output of inverter 16 is signal V2. Signal V2 is a logical low only when signal C is a logical high and signal NTEST is a logical low. For all other logic states of signals C and signal NTEST, signal V2 is a logical high. When signal NTEST is high, signal V2 follows clock input C; when signal NTEST is low, signal V2 stays high.

Signals CLKZ and V2 are inputs to a transparent latch, which is indicated generally at 18, of FIG. 2. Transparent latch 18 includes an input signal D and an output signal Q. In the first stage 20 of transparent latch 18, input signal D is coupled to the gate of p-channel transistor 22 and the gate of n-channel transistor 24. Signal CLKZ is coupled to the input of p-channel transistor 26, and signal V2 is coupled to the input of n-channel transistor 28. The midpoint of transistors 22, 24, 26, and 28 is a signal N1. Signal N1 may be pulled to the voltage rail $V_{DD}$ if transistors 22 and 26 are turned on or may be pulled to ground if transistors 24 and 28 are turned on. Signal N1 is an input to inverter 30. In the second stage 32 of transparent latch 18, signal N2 is coupled to the gate of p-channel transistor 34 and the gate of n-channel transistor 36. Signal V2 is coupled to the gate of p-channel transistor 38, and signal CLKZ is coupled to the gate of n-channel transistor 40. The input of inverter 41 is the midpoint of transistors 34, 36, 38, and 40. The output of inverter 41 is output signal Q.

When signal NTEST is a logical low, indicating that the latch is in testing mode, transparent latch 18 behaves like a buffer, and the signal at input signal D is permitted to propagate to the output signal Q. As an example, when signal NTEST is a logical low, it can be seen from conditioning circuit 10 of FIG. 1 that signal CLKZ is a logical low and signal V2 is a logical high. The logic states of signals CLKZ and V2 in transparent latch 18 of FIG. 2 cause transistors 26 and 28 to turn on. Because transistors 26 and 28 are turned on, signal N1 is either pulled high or low depending on the logic state of input signal D. If input signal D is high, transistor 24 is turned on, transistor 22 is turned off, and signal N1 is pulled low. If input signal D is low, transistor 22 is turned on, transistor 24 is turned off, and signal N1 is pulled high. In the second stage 32 of transparent latch 18, the logic states of signals CLKZ and V2 of this example cause transistors 38 and 40 to turn off. Because transistors 38 and 40 are turned off, signal N2 has no effect on the input of inverter 41. The logic state of signal N1 is inverted and output as output signal Q. In summary, if input signal D is high, signal N1 is low and output signal Q is high. If input signal D is low, signal N1 is high and output signal Q is low.

If input signal D changes its logic state while signal NTEST is low, the new logic state of input signal D will propagate through transparent latch 18 to output signal Q. A change to the logic state of input signal D will cause one of transistors 22 and 24 to turn on and one of transistors 22 and 24 to turn off. Transistors 26 and 28 will remain on, and transistors 38 and 40 will remain off. Signal N1 will be passed through inverter 41 to output signal Q. Thus, when the logic circuitry is in test mode and signal NTEST is low, transparent latch 18 behaves like a buffer or flow-through logic circuitry. The logic state of clock C has no effect on the operation of transparent latch 18. Transparent latch propagates the signal at input signal D regardless of the status of clock C. As such, during test mode, the transparent latch 18 behaves as a flow-through logic circuit and it allows the rest of the logic circuitry to be testable according to existing test methodologies.

When signal NTEST is a logical high, indicating that the latch is in operational mode, the state of signals CLKZ and V2 depend on the state of clock signal C. Signal CLKZ is low and signal V2 is high when clock signal C is high and signal NTEST is high. Signal CLKZ is low and signal V2 is high when clock signal C is low and signal NTEST is high. When clock signal C is high and the logic circuitry is not in test mode (signal NTEST is high), transparent latch 18 still behaves as a buffer or flow-through logic circuitry. In this example, when the transparent latch is in buffer mode, signal CLKZ is low and signal V2 is high. The logic states of signals CLKZ and V2 in transparent latch 18 of FIG. 2 cause transistors 26 and 28 to turn on. Because transistors 26 and 28 are turned on, signal N1 is either pulled high or low depending on the logic state of input signal D. If input signal D is high, transistor 24 is turned on, transistor 22 is turned off, and signal N1 is pulled low. If input signal D is low, transistor 22 is turned on, transistor 24 is turned off, and signal N1 is pulled high. In the second stage 32 of transparent latch 18, the logic states of this example cause transistors 38 and 40 to turn off. Because transistors 38 and 40 are turned off, signal N2 has no effect on inverter 41. The logic state of signal N1 is inverted and output as output signal Q. In summary, if input signal D is high, signal N1 is low, and output signal Q is high. If input signal D is low, signal N1 is high and output signal Q is low.

If input signal D changes its logic state while clock signal C is high and signal NTEST is high, the new logic state of input signal D will propagate through transparent latch 18 to output signal Q. A change to the logic state of input signal D will cause one of transistors 22 and 24 to turn on and one of transistors 22 and 24 to turn off. Transistors 26 and 28 will remain on, and transistors 38 and 40 will remain off. Signal N1 will be passed through inverter 41 to output signal Q. In this mode of operation, when clock signal C is high and signal NTEST is high, transparent latch 18 behaves like a buffer or flow-through logic circuitry.

When clock signal C is low and signal NTEST is high, transparent latch 18 holds its output signal Q regardless of changes to input signal D. When clock signal C is low and signal NTEST is high, signal CLKZ is high and signal V2 is low. The state of signals CLKZ and V2 causes transistors 26 and 28 to turn off. Turning off transistors 26 and 28 isolates signal N1 at the midpoint of transistors 26 and 28. If the previous output signal Q was a logical high during the period that transparent latch 18 was acting as a buffer or flow-through circuitry, then signal N1 was a logical low. When signal CLKZ is a logical high and signal N1 is a logical low, transistor 40 is turned on and transistor 36 is turned on because of the inversion of signal N1 through inverter 30. Transistor 34 is turned off. The input of inverter 41 is pulled to ground, causing signal N1 to remain low, which in turn causes output signal Q to remain a logical high. If the previous output signal Q was a logical low during the period that transparent latch 18 was acting as a buffer or flow-through circuitry, then signal N1 was a logical high. When signal V2 is a logical low and signal N1 is a logical high, transistor 34 and 38 are turned on. Transistor 36 is turned off. The input of inverter 41 is pulled to the voltage rail $V_{DD}$, causing output signal Q to remain a logical low. Thus, when transparent latch is not in test mode (signal NTEST is high), and clock signal C is low, transparent latch holds its output at the existing state of output signal Q regardless of changes to input D.

Thus, by conditioning input signals CLKZ and V2 to transparent latch 18, transparent latch can be set to a test mode (signal NTEST is low in conditioning circuit 10) such that transparent latch 18 acts as a buffer or flow-through logic circuitry regardless of changes to clock signal C. Alternatively, transparent latch can be set to an operational mode (signal NTEST is high in conditioning circuit 10) such that transparent latch 18 acts as a transparent latch, holding the output when the clock signal of conditioning circuit 10 is low and operating as a buffer or flow-through circuitry when the clock signal of conditioning circuit 10 is high.

FIG. 3a is a logic gate diagram of a conditioning circuit for another embodiment of a transparent latch. The conditioning circuit is indicated generally at 42. Clock signal C is an input to inverter 44. The output of inverter 44 is signal CLKZ, which is an input to inverter 46. The output of inverter 46 is signal V2. FIG. 3b is a logic gate diagram of another conditioning circuit. The conditioning circuit of FIG. 3b is an inverter that receives signal NTEST as its input. The output of the conditioning circuit of FIG. 3b is signal TEST. FIG. 4 is a circuit diagram of a transparent latch of the present invention. The transparent latch is indicated generally at 48. Input signal D is an input to the first stage 50 of transparent latch 48. Input D is coupled to the gates of p-channel transistor 52 and n-channel transistor 54. Signal CLKZ is coupled to the gate of p-channel transistor 56, and signal V2 is coupled to the gate of n-channel transistor 58. Coupled between the drain and source of transistor 56 are the drain and source of p-channel transistor 60, and coupled between the drain and source of transistor 58 are the drain and source of n-channel transistor 62. Signal NTEST is coupled to the gate of transistor 60 and signal TEST, which is the logical opposite of signal NTEST, is coupled to the gate of transistor 62.

Signal N1 is present at the source of transistors 56 and 60 and at the drain of transistors 58 and 62 in FIG. 4. Signal N1 is an input to inverter 64. The output of inverter 64, signal N2, is coupled to the gates of p-channel transistor 66 and n-channel transistor 68 of the second stage 80 of transparent latch 48. Signal TEST is coupled to the gate of p-channel transistor 70 and signal NTEST is coupled to the gate of n-channel transistor 72. Signal V2 is coupled to the gate of p-channel transistor 74 and signal CLKZ is coupled to the input of n-channel transistor 76. Signal N1 is coupled to the input of inverter 78. The output of inverter 78 is output signal Q.

In testing mode, when signal NTEST is low, transparent latch 48 behaves like a buffer or flow-through logic circuitry, permitting input signal D to propagate through transparent latch 48 to output signal Q. If signal NTEST is low, signal TEST is high, turning on transistors 60 and 62. If input signal D is high, transistor 54 is turned on and transistor 52 is turned off, pulling signal N1 to ground. If input signal D is low, transistor 52 is turned on and transistor 54 is turned off, pulling signal N1 to voltage rail $V_{DD}$. The logic states of signals NTEST and TEST cause transistors 70 and 72 to turn off, isolating the input of inverter 78 from the voltage rail $V_{DD}$ and ground in the second stage 80. The logic state of signal N1 is inverted through the inverter 78 and the logic state of input signal D matches the logic state of output signal Q. It can be seen from the operation of transparent latch 48 when signal NTEST is low that the states of signals C, CLKZ, and V2 do not affect the operation of transparent latch 48. In the first stage 50 of transparent latch 48, input signal D turns on one of transistors 52 and 54 and turns off the other of transistors 54 and 58, while on transistors 60 and 62 provide a bypass to the voltage rail $V_{DD}$ and ground. Because of the logic states of signals NTEST and TEST, signal N1 is coupled to either the voltage rail $V_{DD}$ or ground. Signals CLKZ and V2 do not contribute to the operation of first stage 50. In second stage 80, signals NTEST and TEST turn off transistors 70 and 72, isolating signal N2, thereby preventing signal N2 from having any effect on the input of inverter 78.

When signal NTEST is high, and consequently TEST is low, transparent latch 48 behaves as a transparent latch. Assuming that signal NTEST is high and signal C is high, signal CLKZ is low and signal V2 is high. With respect to first stage 50 of transparent latch 48, the logic states of CLKZ and V2 turn on transistors 56 and 58, while signals NTEST and TEST turn off transistors 60 and 62. If the logic state of input signal D is high, transistor 54 will be turned on, transistor 52 will be turned off, and signal N1 will be pulled to ground. If the logic states of input signal D is low, transistor 52 will be turned on, transistor 54 will be turned off, and signal N1 will be pulled to the voltage rail $V_{DD}$. In this manner, signal N1 will be pulled to a voltage level that is the logical opposite of the voltage level of input signal D. In second stage 80 of transparent latch 48, the logic states of signals NTEST and TEST turn transistors 70 and 72 on, while the logic states of signals CLKZ and V2 turn transistors 74 and 76 off. While transistors 74 and 76 are turned off, signal N1 is passed to the input of inverter 78, where it is inverted as output signal Q. In this manner, transparent latch 48 behaves as a buffer or flow-through circuitry, causing output signal Q to follows the logic state of input signal D, when clock signal C is high and signal NTEST is high.

When signal NTEST is high and signal C is low, transparent latch 48 stores its output signal Q regardless of changes to input signal D. When signal NTEST is high, signal TEST is low and transistors 60 and 62 of first stage 50 of transparent latch 48 are turned off. When signal C is low, signal CLKZ is high and signal V2 is low, turning signals 56 and 58 off. Because of the logic states of signals NTEST, TEST, CLKZ, and V2, signal N1 is isolated from the voltage rail $V_{DD}$ and ground in the first stage 50. As such, changes to input signal D have no effect on the logic state of signal N1. In second stage 80 of transparent latch 48, the logic states of signals NTEST and TEST turn on transistors 70 and 72, and the logic states of signals CLKZ and V2 turn on transistors 74 and 76. Signal N1 is an input to inverter 64. The output of inverter 64, signal N2, is coupled to the gates of transistors 66 and 68. Signal N2 turns on one of transistors 66 and 68 and turns off the other of transistors 66 and 68.

As such, if N1 is a logical high, indicating that output signal Q was low when clock signal C was high, signal N2 is a logical low, turning on transistor 66 and turning off transistor 68. The input of inverter 78 is pulled to the voltage rail $V_{DD}$ and the output of inverter 78, which is output signal Q, is a logical low. In this manner, the logic state of output signal Q will not change and is stored even if input signal D is changed. If signal N1 is a logical low, indicating that output signal Q was high when clock signal C was high, signal N2 is a logical high, turning on transistor 68 and turning off transistor 66. The input of inverter is pulled to ground and the output of inverter 78, which is output signal Q, is a logical high. Thus, transparent latch 48 behaves like a transparent latch when signal NTEST is high, causing output signal Q to hold its logic state when clock signal C is low.

The logic circuitry of the present invention is advantageous in that it permits a transparent latch to operate as a buffer during the testing operation. In this manner, a transparent latch permits the logic circuitry to be testable according to existing testing schemes for testing logic circuitry. The number of transistors that must be added to the circuit topology of a transparent latch to achieve the functionality of the transparent latch of the present invention is minimal. The quality and reliability of logic circuitry is improved by the testability characteristics of the transparent latch disclosed herein.

Although the present invention has been described in detail, it should be understood that various changes, substitutions, and alterations can be made thereto without departing from the spirit and scope of the invention as defined by the appended claims.

What is claimed is:

1. A transparent latch and conditioning circuit, comprising:

a clock input signal received as an input to the conditioning circuit;

a testing signal received as an input to the conditioning circuit;

wherein the conditioning circuit performs an operation on the clock input signal and the testing signal and provides conditioning circuit output signals to the transparent latch;

wherein the transparent latch receives the conditioning circuit output signal and performs an operation on a transparent latch input signal to produce a transparent latch output signal in response to the conditioning circuit output signals; and wherein the transparent latch performs an operation to cause the transparent latch output signal to follow the transparent latch input signal when the testing signal indicates that the transparent latch is in testing mode.

2. The transparent latch and conditioning circuit of claim 1, wherein the transparent latch causes the transparent latch output signal to follow the transparent latch input signal when the testing signal indicates that the transparent latch is not in testing mode and the clock input signal is in a first logic state.

3. The transparent latch and conditioning circuit of claim 1, wherein the transparent latch holds the state of the transparent latch output signal when the testing signal indicates that the transparent latch is not in testing mode and the clock input signal is in a second logic state.

4. The transparent latch and conditioning circuit of claim 1, wherein the transparent latch causes the transparent latch output signal to follow the transparent latch input signal when the testing signal indicates that the transparent latch is not in testing mode and the clock input signal is in a first logic state; and wherein the transparent latch holds the state of the transparent latch output signal when the testing signal indicates that the transparent latch is not in testing mode and the clock input signal is in a second logic state.

5. A transparent latch, comprising:

an input signal;

a first conditioned clock signal;

a second conditioned clock signal;

a testing signal;

an inverted testing signal;

a first stage, the first stage including,
  a first stage output signal; and
  a plurality of transistors, the plurality of transistors operative to receive as inputs the input signal, the first conditioned clock signal, the second conditioned clock signal, the testing signal, and the inverted testing signal, wherein the plurality of transistors couple the first stage output signal to ground or a voltage rail when the transparent latch is in testing mode; and a second stage, the second stage including,
  an output signal; and
  a plurality of transistors, the plurality of transistors operative to receive as inputs the inversion of the first stage output signal, the first conditioned clock signal, the second conditioned clock signal, the testing signal, and the inverted testing signal, wherein the plurality of transistors isolate the first stage output signal from ground and the voltage rail when the transparent latch is in testing mode.

6. The transparent latch of claim 5, wherein the plurality of transistors of the first stage couple the first stage output signal to ground or the voltage rail when the transparent latch is not in a testing mode, the first conditioned clock signal is in a first logic state, and the second conditioned clock signal is in a second logic state; and wherein the plurality of transistors of the second stage isolate the first stage output signal from ground and the voltage rail when the transparent latch is not in a testing mode, the first conditioned clock signal is in a first logic state, and the second conditioned clock signal is in a second logic state.

7. The transparent latch of claim 5, wherein the plurality of transistors of the first stage isolate the first stage output signal from ground and the voltage rail when the transparent latch is not in testing mode, the first conditioned clock signal is in a third logic state, and the second conditioned clock signal is in a fourth logic state; and wherein the plurality of transistors of the second stage couple the first stage output signal to ground or the voltage rail when the transparent latch is not in testing mode, the first conditioned clock signal is in a third logic state, and the second conditioned clock signal is in a fourth logic state.

8. A method for testing a logic circuit that includes a transparent latch, comprising the steps of:

applying a testing signal to the transparent latch when the transparent latch is in a test mode, the testing signal causing the transparent latch to function as a buffer when the transparent latch is in test mode; and removing the test signal from the transparent latch when the transparent latch is not in test mode, the removal of the transparent latch causing the transparent latch to function as a buffer when a clock signal coupled to the transparent latch is in a first logic state and to hold the output of the transparent buffer when the clock signal is in a second logic state.

9. The method for testing a logic circuit that includes a transparent latch of claim 8, wherein the step of applying a testing signal comprises the step of applying a testing signal to cause the output of the transparent latch to follow an input of the transparent latch without reference to the logic state of the clock signal.

10. A method for testing a logic circuit that includes a transparent latch, comprising the steps of:

conditioning a clock signal and a testing signal to produce a conditioned clock output signal; and providing the conditioned clock output signal as an input to the transparent latch, the conditioned clock output signal causing the transparent latch to operate as a buffer when the transparent latch is in a testing mode.

11. The method for testing a logic circuit that includes a transparent latch of claim 10, wherein the step of providing the conditioned clock output signal to the transparent latch causes the transparent latch to operate as a buffer without regard to the logic state of the clock signal.

12. The method of testing a logic circuit that includes a transparent latch of claim 10, wherein the step of providing the conditioned clock output signal to the transparent latch causes the transparent latch to operate as a transparent latch when the transparent latch is not in testing mode.

* * * * *